(12) United States Patent
Yu et al.

(10) Patent No.: US 11,512,251 B2
(45) Date of Patent: Nov. 29, 2022

(54) RARE-EARTH HALIDE SCINTILLATING MATERIAL AND APPLICATION THEREOF

(71) Applicants: GRIREM ADVANCED MATERIALS CO., LTD., Beijing (CN); GENERAL RESEARCH INSTITUTE for NONFERROUS METALS, Beijing (CN)

(72) Inventors: Jinqiu Yu, Beijing (CN); Chengpeng Diao, Beijing (CN); Hao Wu, Beijing (CN); Lei Cui, Beijing (CN); Huaqiang He, Beijing (CN)

(73) Assignees: GRIREM ADVANCED MATERIALS CO., LTD., Beijing (CN); GENERAL RESEARCH INSTITUTE FOR NONFERROUS METALS, Beijing (CN)

( * ) Notice: Subject to any disclaimer, the term of this patent is extended or adjusted under 35 U.S.C. 154(b) by 271 days.

(21) Appl. No.: 16/620,850

(22) PCT Filed: Oct. 15, 2018

(86) PCT No.: PCT/CN2018/110183
§ 371 (c)(1),
(2) Date: Dec. 9, 2019

(87) PCT Pub. No.: WO2019/128388
PCT Pub. Date: Jul. 4, 2019

(65) Prior Publication Data
US 2020/0318005 A1    Oct. 8, 2020

(30) Foreign Application Priority Data
Dec. 27, 2017 (CN) .......................... 201711446351.5

(51) Int. Cl.
| | | |
|---|---|---|
| *G01T 1/29* | (2006.01) | |
| *G01T 1/36* | (2006.01) | |
| *C09K 11/77* | (2006.01) | |
| *C01F 17/253* | (2020.01) | |
| *C01F 17/271* | (2020.01) | |
| *C30B 29/12* | (2006.01) | |
| *G01T 1/202* | (2006.01) | |
| *E21B 49/00* | (2006.01) | |

(52) U.S. Cl.
CPC ........ *C09K 11/7772* (2013.01); *C01F 17/253* (2020.01); *C01F 17/271* (2020.01); *C09K 11/7719* (2013.01); *C30B 29/12* (2013.01); *G01T 1/2023* (2013.01); *E21B 49/00* (2013.01); *G01T 1/2985* (2013.01); *G01T 1/362* (2013.01)

(58) Field of Classification Search
CPC . C09K 11/7772; C09K 11/7719; C09K 11/08; C09K 11/77; C01F 17/253; C01F 17/271; C30B 29/12; C30B 11/00; G01T 1/2023; G01T 1/2985; G01T 1/362; E21B 49/00; E21B 47/00; C01P 2002/54
See application file for complete search history.

(56) References Cited

U.S. PATENT DOCUMENTS

| | | | | |
|---|---|---|---|---|
| 7,067,815 B2 * | 6/2006 | Dorenbos | ............. | C01F 17/253 |
| | | | | 250/370.11 |
| 7,067,816 B2 * | 6/2006 | Dorenbos | ............. | C01F 17/271 |
| | | | | 250/370.11 |
| 7,250,609 B2 * | 7/2007 | Dorenbos | ............. | C01F 17/271 |
| | | | | 250/370.11 |
| 7,332,028 B2 * | 2/2008 | Litis | ........................ | C30B 11/00 |
| | | | | 117/2 |
| 7,479,637 B2 * | 1/2009 | Dorenbos | ............. | C01F 17/271 |
| | | | | 250/361 R |
| 7,608,201 B2 * | 10/2009 | Litis | ........................ | C30B 11/00 |
| | | | | 250/361 R |

(Continued)

FOREIGN PATENT DOCUMENTS

| | | |
|---|---|---|
| CN | 1404523 A | 3/2003 |
| CN | 102838992 A | 12/2012 |
| CN | 105102583 A | 11/2015 |
| CN | 106967413 A | 7/2017 |
| CN | 107487778 A | 12/2017 |
| JP | 2010285559 A | 12/2010 |

OTHER PUBLICATIONS

International Search Report of PCT/CN2018/110183.
Written Opinion of PCT/CN2018/110183.

*Primary Examiner* — David P Porta
*Assistant Examiner* — Djura Malevic
(74) *Attorney, Agent, or Firm* — Dragon Sun Law Firm, PC; Jinggao Li; Nathaniel Perkins

(57) ABSTRACT

The present invention provides a rare-earth halide scintillating material and application thereof. The rare-earth halide scintillating material has a chemical formula of $RE_aCe_bX_3$, wherein RE is a rare-earth element La, Gd, Lu or Y, X is one or two of halogens Cl, Br and I, $0 \leq a \leq 1.1$, $0.01 \leq b \leq 1.1$, and $1.0001 \leq a+b \leq 1.2$. By taking a +2 valent rare-earth halide having the same composition as a dopant to replace a heterogeneous alkaline earth metal halide in the prior art for doping, the rare-earth halide scintillating material is relatively short of a halogen ion. The apparent valence state of a rare-earth ion is between +2 and +3. The rare-earth halide scintillating material belongs to non-stoichiometric compounds, but still retains a crystal structure of an original stoichiometric compound, and has more excellent energy resolution and energy response linearity than the stoichiometric compound.

13 Claims, No Drawings

(56) References Cited

U.S. PATENT DOCUMENTS

| | | | |
|---|---|---|---|
| 7,670,578 B2* | 3/2010 | Iltis | C04B 35/5152 423/491 |
| 7,767,971 B2* | 8/2010 | Van Eijk | C04B 35/5152 250/361 R |
| 7,767,975 B2* | 8/2010 | Flamanc | G01T 1/202 250/361 R |
| 8,021,636 B2* | 9/2011 | Iltis | C04B 35/5152 250/361 R |
| 8,252,260 B2* | 8/2012 | Iltis | C30B 29/12 423/263 |
| 8,470,089 B2* | 6/2013 | Richaud | C30B 33/02 117/9 |
| 8,629,403 B2* | 1/2014 | Vyprintsev | C01F 17/253 250/361 R |
| 8,889,036 B2* | 11/2014 | Simonetti | G21K 4/00 250/269.1 |
| 10,053,624 B2* | 8/2018 | Menge | C04B 35/5152 |
| 10,203,421 B2* | 2/2019 | Dorenbos | C09K 11/7772 |
| 10,442,989 B2* | 10/2019 | Menge | C04B 35/553 |
| 10,538,861 B1* | 1/2020 | Shah | C09K 11/77 |
| 10,564,298 B2* | 2/2020 | Dorenbos | G21K 4/00 |
| 10,947,452 B2* | 3/2021 | Menge | C04B 35/553 |
| 11,187,818 B2* | 11/2021 | Dorenbos | G21K 4/00 |
| 2004/0149917 A1* | 8/2004 | Dorenbos | C01F 17/271 250/361 R |
| 2004/0238747 A1* | 12/2004 | Dorenbos | G01T 1/2023 250/361 R |
| 2005/0188914 A1* | 9/2005 | Litis | C30B 15/00 117/2 |
| 2006/0104880 A1* | 5/2006 | Iltis | C30B 29/12 252/301.4 H |
| 2006/0197026 A1* | 9/2006 | Dorenbos | C01F 17/271 250/370.11 |
| 2007/0210256 A1* | 9/2007 | Dorenbos | C09K 11/7772 250/361 R |
| 2008/0067391 A1* | 3/2008 | Shimizu | C09K 11/7772 250/361 R |
| 2012/0001074 A1* | 1/2012 | Hardy | C09K 11/7701 250/361 R |
| 2012/0186061 A1* | 7/2012 | Simonetti | G01T 1/202 252/301.4 H |
| 2014/0117242 A1* | 5/2014 | Dorenbos | C09K 11/7772 250/361 R |
| 2016/0122641 A1* | 5/2016 | Carey | C09K 11/7783 427/419.1 |
| 2016/0200972 A1* | 7/2016 | Dorenbos | C09K 11/7772 156/242 |
| 2018/0355245 A1* | 12/2018 | Carey | C09K 11/7705 |
| 2020/0318005 A1* | 10/2020 | Yu | C30B 29/12 |
| 2020/0339878 A1* | 10/2020 | Doren | G01T 1/2023 |
| 2021/0340442 A1* | 11/2021 | Carey | G01T 1/2023 |
| 2022/0134131 A1* | 5/2022 | Bourke, Jr. | H01L 24/83 607/88 |

* cited by examiner

RARE-EARTH HALIDE SCINTILLATING MATERIAL AND APPLICATION THEREOF

CROSS-REFERENCE TO RELATED APPLICATIONS

This application is a national stage application of PCT Application No. PCT/CN2018/110183. This application claims priority from PCT Application No. PCT/CN2018/110183 filed Oct. 15, 2018, and CN 201711446351.5 filed Dec. 27, 2017, the contents of which are incorporated herein in the entirety by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention relates to the field of inorganic scintillating materials, and more particularly, to a rare-earth halide scintillating material and application thereof.

BACKGROUND

A scintillating material can be configured to detect such high-energy rays as α-rays, γ-rays, X-rays, and such high-energy particles as neutrons, and is extensively used in the fields of nuclear medicine, high-energy physics, security inspection, oil logging, etc.

The scintillating material is usually applied in the form of single crystals, and in some cases may also be in ceramic or other forms. In different application fields, the demands on the performance of the scintillating material are different. For most application fields, actually it is desirable for the scintillating material to have a light yield as high as possible, a decay time as short as possible, and an energy resolution as high possible. Especially for such nuclear medicine imaging devices as a positron emission tomography (PET), these parameters are critical to the imaging quality.

A $LaBr_3$:Ce crystal disclosed by E. V. D. van Loef et al. in 2001 has a very high light output (>60,000 ph/MeV), a very short decay time (<30 ns) and a very high energy resolution (about 3%@662 keV) and thus is a scintillating material with extremely excellent performance. Other rare-earth halide scintillating crystals that have been disclosed include: $CeBr_3$, $LaCl_3$:Ce, $LuI_3$:Ce, $YI_3$:Ce and $GdI_3$:Ce, which also have excellent scintillation properties.

However, some conventional rare-earth halide scintillating crystals are all stoichiometric compounds, and rare-earth ions in these compounds are in stable +3 valence.

Doping with an alkaline earth metal ion can further improve the energy resolution and the energy response linearity of the $LaBr_3$:Ce crystal. However, due to differences in radius and valence state between the alkaline earth metal ion and the rare-earth ion, such doping is liable to cause crystal growth defects and is relatively limited in doping concentration. Co-doping a halogen ion and the alkaline earth metal ion can effectively solve this problem, increase the doping concentration of the alkaline earth metal ion and reduce the crystal growth defects. However, this solution also has its shortcomings. That is, the compositions are relatively complicated, and the consistency of the scintillation property of the crystal is poor due to uneven distribution of the different ions.

The rare-earth ion and alkaline earth metal ion in the doped LaBr3:Ce crystal are respectively in stable +3 valence and +2 valence. The doped LaBr3:Ce crystal is also a stoichiometric compound. Therefore, a heretofore unaddressed need exists in the art to address the aforementioned deficiencies and inadequacies.

SUMMARY

A main objective of the present invention is to improve the performance of a conventional rare-earth halide scintillating material by providing a rare-earth halide scintillating material and application thereof.

To achieve the above objective, according to one aspect of the present invention, there is provided a rare-earth halide scintillating material having a chemical formula of $RE_aCe_bX_3$, wherein RE is a rare-earth element La, Gd, Lu or Y, X is one or two of halogens Cl, Br and I, $0 \leq a \leq 1.1$, $0.01 \leq b \leq 11.1$, and $1.0001 \leq a+b \leq 1.2$.

Further, RE is La, and X is Br.
Further, RE is La, and X is Cl.
Further, RE is Gd, Lu or Y, and X is I.
Further, $0.9 \leq a \leq 1$, $0.02 \leq b \leq 0.2$, and $1.0001 \leq a+b \leq 1.1$.
Further, $a=0$, and $1.0001 \leq b \leq 1.1$.
Further, the scintillating material is a single crystal.
Further, the rare-earth halide scintillating material is obtained by the Bridgeman-Stockbarge method.

To achieve the above objective, according to one aspect of the present invention, there is provided a scintillation detector, including a scintillating material which is any of the rare-earth halide scintillating materials described above.

According to the other aspect of the present invention, there is provided a PET, a gamma spectrometer, an oil logging instrument or a lithology scanning imager including the above-mentioned scintillation detector.

According to the technical solutions of the present invention, by taking a +2 valent rare-earth halide (for example, $LaBr_2$) having the same composition as a dopant to replace a heterogeneous alkaline earth metal halide (for example, $SrBr_2$) in the prior art for doping, not only can the same doping effect be achieved but also the problems of uneven segregation, etc. caused by introduction of a heterogeneous alkaline earth metal ion can be effectively avoided. The rare-earth halide scintillating material is relatively short of a halogen ion. The apparent valence state of a rare-earth ion is between +2 and +3. The rare-earth halide scintillating material belongs to non-stoichiometric compounds, but still retains a crystal structure of an original stoichiometric compound, and has more excellent energy resolution and energy response linearity than the stoichiometric compound.

DETAILED DESCRIPTION

It should be noted that in case of no conflict, the embodiments and features in the embodiments of the present application can be combined with each other. The present invention will be illustrated in detail below with reference to the embodiments.

To achieve the above objective, according to one aspect of the present invention, there is provided a rare-earth halide scintillating material having the chemical formula of $RE_aCe_bX_3$, wherein RE is a rare-earth element La, Gd, Lu or Y, X is one or two of halogens Cl, Br and I, $0 \leq a \leq 1.1$, $0.01 \leq b \leq 1.1$, and $1.0001 \leq a+b \leq 0.2$.

According to the rare-earth halide scintillating material provided by the present invention, by taking a +2 valent rare-earth halide (for example, $LaBr_2$) having the same composition as a dopant to replace a heterogeneous alkaline earth metal halide (for example, $SrBr_2$) in the prior art for doping, not only can the same doping effect be achieved but also the problems of uneven segregation, etc. caused by introduction of a heterogeneous alkaline earth metal ion can be effectively avoided. The rare-earth halide scintillating material is relatively short of a halogen ion. The apparent valence state of a rare-earth ion is between +2 and +3. The rare-earth halide scintillating material belongs to non-stoichiometric compounds, but still retains a crystal structure of an original stoichiometric compound, and has more excellent energy resolution and energy response linearity than the stoichiometric compound.

Preferably, RE and X are combined in any of the following ways: La and Br, La and Cl, Gd and I, Lu and I, and Y and I. Rare-earth halides adopting the above combinations have more excellent performance than rare-earth halides adopting other combinations. Scintillating materials formed by the same rare-earth element and different halide ions have different scintillation properties. For example, in $Ce^{3+}$-activated lanthanum halide, $LaBr_3$ has a very high light yield, $LaCl_3$ also has a relatively higher light yield which is obviously lower than that of $LaBr_3$, and $LaI_3$ almost does not emit light at room temperature. The light yields of $Ce^{3+}$-activated Gd, Lu and Y iodides are obviously higher than those of corresponding bromides and chlorides. Therefore, the preferred combinations of La and Br, La and Cl, Gd and I, Lu and I, and Y and I have the best comprehensive scintillation properties and also have the characteristics of high light yield, high energy resolution and short decay time.

It should be noted that the proportion of a rare-earth ion to a halide ion in a non-stoichiometric compound is only limited to a relatively narrower range. In the present invention, the value range of the rare-earth ion is $1.0001 \leq a+b \leq 1.2$, preferably, $1.0001 \leq a+b \leq 1.1$. An over high proportion of the rare-earth ion will cause a series of problems including decrease of the crystal light yield, increase of the crystal growth defect, etc., which may be related to the increase of halide ion vacancies, the change of a crystal energy band structure and phase segregation. Further preferably, $0.9 \leq a \leq 1$, $0.02 \leq b \leq 0.2$, and $1.0001 \leq a+b \leq 1.1$ or $a=0$, $1.0001 \leq b \leq 1.1$. From the perspective of the product comprehensive performance, the proportion of the rare-earth ion in the rare-earth halide scintillating material is within the above preferred range.

The rare-earth halide scintillating material is in the form of powder, ceramics or single crystals, and is preferably applied in the form of single crystals obtained by the Bridgeman-Stockbarge method.

The present invention further relates to a scintillation detector including the rare-earth halide scintillating material, as well as a PET, a gamma spectrometer, an oil logging instrument or a lithology scanning imager including the scintillation detector. Relevant devices adopting the rare-earth halide scintillating material provided by the present invention are relatively higher in consistency of crystal scintillation properties.

It should be noted that the rare-earth halide scintillating material provided by the present invention is a non-stoichiometric compound. That is, the apparent valence state of the rare-earth ion is not generally +3, but between +2 and +3. In the present invention, the consistency of the scintillation property of the rare-earth halide scintillating material is improved by adjusting the proportion of the rare-earth ion to the halide ion.

The present invention initially studies the doping modification solution of $LaBr_3$:Ce to solve the problems of too complicated compositions, difficult crystal growth and poor consistency of the scintillation property, caused by co-doping of the halide ion and an alkaline earth metal ion in a conventional doping solution. At present, the function mechanism that the alkaline earth metal ion is doped to improve the scintillation property of a $LaBr_3$:Ce crystal is not yet very clear. It is generally believed that this function mechanism is relevant to a valence transition of some $Ce^{3+}$ to $Ce^{4+}$ in the crystal arising from the doping of a +2 valent alkaline ion. The inventor proposes that by taking a +2 valent rare-earth halide (for example, $LaBr_2$) having the same composition as a dopant to replace a heterogeneous alkaline earth metal halide (for example, $SrBr_2$) in the prior art for doping, not only can the same doping effect be theoretically achieved but also the problems of uneven segregation, etc. caused by introduction of a foreign ion can be effectively avoided. A rare-earth halide obtained in this way is relatively short of a halogen ion. The apparent valence state of a rare-earth ion is between +2 and +3. Thus, the rare-earth halide is a non-stoichiometric compound.

Since the +2 valent rare-earth halide with the unstable valence state, for example, $LaBr_2$, is generally difficult to obtain, in practice, another equivalent solution is adopted in the present invention for replacement. That is, a small amount of a rare-earth metal (for example, La) is added into the stable stoichiometric rare-earth halide (for example, $LaBr_3$) and high-temperature melting is performed to obtain a target non-stoichiometric rare-earth halide having a uniform composition. The stoichiometric rare-earth halide and the rare-earth metal, of which the production methods are mature, are readily available on the market, the alternative solution is relatively lower in cost and is operable.

According to one embodiment of the present invention, a non-stoichiometric lanthanum bromide crystal obtained in the present invention has an extremely excellent scintillation property, and its comprehensive performance is obviously superior to that of a conventional undoped lanthanum bromide crystal, and is superior to those of alkaline-earth-doped and alkaline earth and halide ion co-doped lanthanum bromide crystals, wherein the superiority is embodied in that the light yield of the crystal is increased to some extent, the decay time is shortened significantly and the energy resolution is improved to some extent. This may be relevant to a halide ion vacancy in the non-stoichiometric crystal. On the one hand, the defect level contributed by the halogen ion vacancy may reduce the band gap of the crystal, resulting in an increase in the light yield of the crystal. On the other hand, the halogen ion vacancy makes it easier to form $Ce^{4+}$ in the crystal, thereby shortening the luminescence decay time. Moreover, compared with the doped lanthanum bromide crystal, the non-stoichiometric lanthanum bromide crystal is free from impurity segregation and is greatly improved in homogeneity. Meanwhile, the growth process of the non-stoichiometric lanthanum bromide crystal is free from such crystal defects as an inclusion and a crack due to impurity enrichment. Thus, the yield of the crystal is improved significantly. The production cost of the crystal is effectively lowered.

It is found that when the technical solution is applied to other rare-earth halide scintillating materials, a favorable implementation effect can also be achieved.

Beneficial effects of the present invention will be further described below with reference to specific embodiments.

It should be noted that in the following Embodiments and Comparative Examples, the light yield and the energy resolution are obtained through multichannel spectrum detection based on a $^{137}Cs$ radioactive source. The decay time is detected by the X-ray fluorescence spectrometry.

Comparative Example 1

119.89 g of anhydrous $LaBr_3$ (the purity is 99.99%, that is, the mass content of $LaBr_3$ is 99.99%, and the following purity means the same) and 6.33 g of anhydrous $CeBr_3$ (with the purity of 99.99%) are accurately weighed in a glove box under atmosphere protection, and mixed uniformly. The obtained mixture is charged into a quartz crucible with the diameter of 25 mm. The quartz crucible is taken out of the glove box and quickly connected to a vacuum system to be vacuumized. When the vacuum degree is $1*10^{-3}$ Pa, an opening of the quartz crucible is sealed by fusing. The quartz crucible is placed in a Bridgeman crystal oven for single-crystal growth. The temperature of a high-temperature area is 850° C. The temperature of a low-temperature area is 700° C. A gradient area has a temperature gradient about 10° C./cm. The crucible descends at a rate of 0.5 mm/h to 2 mm/h. The total growth time is about 15 days. The obtained crystal is transparent and colorless and is about 5 cm in length. The crystal is cut and processed in the glove box into a cylindrical sample of Φ25 mm*25 mm. After that, tests of the light yield, the decay time and the energy resolution are performed.

Comparative Example 2

119.89 g of anhydrous $LaBr_3$ (with the purity of 99.99%), 6.33 g of anhydrous $CeBr_3$ (with the purity of 99.99%) and 0.041 g of anhydrous $SrBr_2$ (with the purity of 99.99%) are accurately weighed in a glove box under Ar atmosphere protection, and mixed uniformly. The obtained mixture is charged into a quartz crucible with the diameter of 25 mm. Other operations are the same as those in Comparative Example 1.

Comparative Example 3

119.89 g of anhydrous $LaBr_3$ (with the purity of 99.99%), 6.33 g of anhydrous $CeBr_3$ (with the purity of 99.99%) and 0.048 g of anhydrous $SrCl_2$ (with the purity of 99.99%) are accurately weighed in a glove box under Ar atmosphere protection, and mixed uniformly. The obtained mixture is charged into a quartz crucible with the diameter of 25 mm. Other operations are the same as those in Comparative Example 1.

Embodiment 1

119.89 g of anhydrous $LaBr_3$ (with the purity of 99.99%), 6.33 g of anhydrous $CeBr_3$ (with the purity of 99.99%) and 1.852 g of metal La (with the purity of 99.99%) are accurately weighed in a glove box under Ar atmosphere protection, and mixed uniformly. The obtained mixture is charged into a quartz crucible with the diameter of 25 mm. Other operations are the same as those in Comparative Example 1.

Other operations of Embodiments 2 to 13 are the same as those of Embodiment 1, except for raw material ratios.

See Table 1 for detailed comparisons of all the Embodiments and Comparative Examples.

TABLE 1

|  | Chemical Formula | Light Yield (ph/MeV) | Decay Time (ns) | Energy Resolution (@662 keV) |
|---|---|---|---|---|
| Comparative Example 1 | $La_{0.95}Ce_{0.05}Br_3$ | 56,000 | 32 | 3.2% |
| Comparative Example 2 | $La_{0.95}Sr_{0.0005}Ce_{0.05}Br_{3.001}$ | 62,000 | 30 | 2.7% |
| Comparative Example 3 | $La_{0.95}Sr_{0.0009}Ce_{0.05}Br_3Cl_{0.0018}$ | 65,000 | 25 | 2.4% |
| Embodiment 1 | $La_{0.97}Ce_{0.05}Br_3$ | 75,000 | 24 | 2.0% |
| Embodiment 2 | $La_{0.95}Ce_{0.1}Br_{2.7}Cl_{0.3}$ | 74,000 | 20 | 2.1% |
| Embodiment 3 | $La_{0.9901}Ce_{0.01}Br_3$ | 68,000 | 20 | 2.2% |
| Embodiment 4 | $LaCe_{0.02}Br_{2.1}I_{0.9}$ | 69,000 | 23 | 2.4% |
| Embodiment 5 | $La_{0.9}Ce_{0.2}Cl_3$ | 51,000 | 21 | 3.3% |
| Embodiment 6 | $Ce_{1.0001}Br_3$ | 60,000 | 17 | 2.9% |
| Embodiment 7 | $Ce_{1.005}Br_3$ | 65,000 | 16 | 2.8% |
| Embodiment 8 | $Ce_{1.1}Br_3$ | 61,000 | 15 | 2.9% |
| Embodiment 9 | $Ce_{1.05}Br_{2.8}Cl_{0.2}$ | 63,000 | 18 | 2.9% |
| Embodiment 10 | $Gd_{1.02}Ce_{0.02}Br_3$ | 49,000 | 31 | 3.8% |
| Embodiment 11 | $Gd_{1.1}Ce_{0.1}I_3$ | 84,000 | 35 | 3.2% |
| Embodiment 12 | $Lu_{1.01}Ce_{0.08}I_{2.5}Br_{0.5}$ | 94,000 | 34 | 3.1% |
| Embodiment 13 | $Y_{0.92}Ce_{0.12}I_3$ | 76,000 | 30 | 3.3% |

As can be seen from the above descriptions, compared with undoped or alkaline-earth-doped crystals and alkaline earth and halide ion co-doped crystals having the same composition, the non-stoichiometric crystal provided by the present invention has extremely excellent scintillation property and shows a relatively more remarkable performance advantage. While the high material performance is guaranteed, the material composition is remarkably simplified, which contributes to obtaining of the high-quality scintillating crystal with favorable consistency. The above embodiments achieve the following technical effect: by adjusting the proportion of the rare-earth ion to the halide ion, a conventional stoichiometric rare-earth halide scintillating material is converted into the non-stoichiometric compound, such that the scintillation property and the growth consistency of the rare-earth halide scintillating material are improved.

The above descriptions are merely preferred embodiments of the present invention, and are not intended to limit the present invention. Various changes and modifications may be made to the present invention by those skilled in the art. Any modifications, equivalent substitutions, improvements, etc. made within the spirit and principle of the present invention should be included within the scope of protection of the present invention.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A rare-earth halide scintillating material having a chemical formula of $RE_aCe_bX_3$, wherein RE is a rare-earth element La, Gd, Lu or Y, X is one or two of halogens Cl, Br and I, $0.9 \leq a \leq 1$, $0.02 \leq b \leq 0.2$, and $1.0001 \leq a+b \leq 1.1$.

2. The rare-earth halide scintillating material according to claim 1, wherein RE is La, and X is Br.

3. The rare-earth halide scintillating material according to claim 1, wherein RE is La, and X is Cl.

4. The rare-earth halide scintillating material according to claim 1, wherein RE is Gd, Lu ear Y, and X is I.

5. The rare-earth halide scintillating material according to claim 1, wherein the scintillating material is a single crystal.

6. The rare-earth halide scintillating material according to claim 5, wherein the rare-earth halide scintillating material is obtained by the Bridgeman-Stockbarge method.

7. A scintillation detector, comprising a scintillating material, wherein the scintillating material is the rare-earth halide scintillating material of claim 1.

8. A positron emission tomography, a gamma spectrometer, an oil logging instrument or a lithology scanning imager, comprising the scintillation detector of claim 7.

9. The scintillation detector according to claim 7, wherein RE is La, and X is Br.

10. The scintillation detector according to claim 7, wherein RE is La, and X is Cl.

11. The scintillation detector according to claim 7, wherein RE is Gd, Lu or Y, and X is I.

12. The rare-earth halide scintillating material according to claim 1, wherein the scintillating material is a single crystal.

13. The rare-earth halide scintillating material according to claim 12, wherein the rare-earth halide scintillating material is obtained by the Bridgeman-Stockbarge.

* * * * *